United States Patent

Ochi et al.

(10) Patent No.: US 6,647,845 B1
(45) Date of Patent: Nov. 18, 2003

(54) SHEET RETAINER FOR PUNCHING CERAMIC GREEN SHEET AND PUNCHING APPARATUS

(75) Inventors: Hiroshi Ochi, Ehime (JP); Shigetoshi Segawa, Ehime (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/719,647

(22) PCT Filed: Apr. 10, 2000

(86) PCT No.: PCT/JP00/02313

§ 371 (c)(1),
(2), (4) Date: Feb. 26, 2001

(87) PCT Pub. No.: WO00/62988

PCT Pub. Date: Oct. 26, 2000

(30) Foreign Application Priority Data

Apr. 15, 1999 (JP) .......................... 11-108418

(51) Int. Cl.[7] .............................................. B26F 1/14
(52) U.S. Cl. .......................................... 83/139; 83/146
(58) Field of Search .......................... 83/139, 128, 140, 83/146, 21, 25, 563, 137, 132, 145, 143, 164

(56) References Cited

U.S. PATENT DOCUMENTS 2,230,043 A * 1/1941 Moran .................. 83/138
3,101,984 A * 8/1963 Wieckmann ............ 439/253
4,215,608 A * 8/1980 Herlan .................. 83/139
5,213,376 A * 5/1993 Szabo .................... 285/39
5,359,914 A * 11/1994 Brown ................... 83/139
5,466,017 A * 11/1995 Szabo et al. ........... 285/319
5,833,277 A * 11/1998 Reinert et al. .......... 285/39

FOREIGN PATENT DOCUMENTS

| JP | 6-16000   | 3/1994 |
| JP | 6-79361   | 3/1994 |
| JP | 8-141992  | 6/1996 |
| JP | 8-174490  | 7/1996 |
| JP | 9-205265  | 8/1997 |

* cited by examiner

Primary Examiner—Allan N. Shoap
Assistant Examiner—Phong Nguyen
(74) Attorney, Agent, or Firm—RatnerPrestia

(57) ABSTRACT

Move, deformation, or damages of a green sheet can be securely prevented by improvement of the material and shape of a green sheet retainer 40 affixed to a punching tool 30 provided with a cutter section 32 for punching a via hole on a ceramic green sheet 20. The sheet retainer 40 of the present invention is composed of an elastic material with hardness between 50 to 60 degrees, and comprises: a support portion 46 disposed on one end in the axial direction with a relatively large outer diameter, thick-walled in the radial direction, and engageable in the punching tool 30; a contact portion 42 disposed on the other end in the axial direction with a relatively small outer diameter, thin-walled in the radial direction, and comes in contact with the green sheet 20; and a housing hole 48 axially extending from the contact portion 42 for housing the cutter section 32.

10 Claims, 2 Drawing Sheets

SHEET RETAINER FOR PUNCHING CERAMIC GREEN SHEET AND PUNCHING APPARATUS

This application is a U.S. National Phase Application of PCT International Application PCT/JP00/02313.

FIELD OF THE INVENTION

The present invention relates to a sheet retainer to be affixed to a punching tool for punching fine through holes such as for wiring on a ceramic green sheet to be used for manufacturing a high-density wiring circuit board and the like and a punching apparatus provided with such a sheet retainer.

BACKGROUND OF THE INVENTION

Numerically controlled die punching apparatus and the like are in use for punching a ceramic green sheet (hereinafter greensheet).

A punching apparatus is provided with a vertically movable punching tool on the tip of which a fine shaft-like or needle-like work pin with a diameter of several mm to less than 1 mm is provided corresponding to the through hole to be punched. Through holes are formed by punching a green sheet with the work pin through the vertical movement of the punching tool.

It happens that the green sheet is pulled; up attached to the work pin that has just punched a green sheet when pulled out from the through hole. This causes problems of deforming the green sheet, cracking it, or deforming the through hole. Also, when the work pin punches the green sheet, the sheet material that comes in contact with the work pin at times slides off or moves, thus disturbing the formation of a through hole at a correct position and with a correct shape.

In order to prevent such lifting and moving of a green sheet, a proposal has been made to affix a sheet retainer called "stripper" for example, to the punching tool.

A sheet retainer is usually composed of hard rubber and is cylindrical in shape with approximately the same diameter encompassing the outer periphery of the work pin when affixed to a punching tool. When the work pin is moved down to punch a green sheet, the tip of the cylindrical sheet retainer comes in contact with the surface of the green sheet. As the work pin is further moved down, the sheet retainer is elastically deformed and keeps pressing the green sheet with its restoring force. During manufacturing the work pin is moved up after punching a through hole. As the elastically deformed sheet retainer keeps pressing the green sheet from above until the work pin has been sufficiently removed from the surface of the green sheet, a lifting of the green sheet is prevented.

A practical construction of a sheet retainer is disclosed in Japanese Laid-Open Patent Publication No. H09-205265. The sheet retainer as described in this document is a rubber-made cover called stripper. The entire body is cylindrical in shape with a relatively thin uniform thickness with only the lower end portion (the portion which comes in contact with the surface of a green sheet) slightly narrowing toward the center. This was for the purpose of preventing lateral slide and vertical moving of the green sheet.

Previous sheet retainers suffer problems :of not being able to fully prevent lifting of a green sheet because of an inappropriate pressure or a too weak pressure on the green sheet, or conversely, deforming or damaging the green sheet because of a too strong pressure.

This is due to variations of the pressure or pressing force against the green sheet which depends on the hardness of the rubber material used as base material of the sheet retainer and the shape of the sheet retainer.

For instance, when a sheet retainer made of a rubber material which is too hard is overly pressed against a green sheet, it may cause a crack in or a deformation of the green sheet. When the rubber material is too soft, the pressing force against the green sheet will be insufficient and securing of the sheet retainer on the punching tool tends to be insufficient.

An object of the present invention is to eliminate the above described problems associated with conventional sheet retainers and to enable one to surely prevent moving, deformation, or damage of a green sheet during punching work.

SUMMARY OF THE INVENTION

A sheet retainer for punching a ceramic green sheet in accordance with the present invention is a sheet retainer to be affixed to a punching tool having a cutter section for punching a through hole on a ceramic green sheet. The sheet retainer is made of a rubber material having a hardness of 50 to 60 degrees (JIS K 6301-1995) and includes a support portion to be engaged; to the punching tool, a contact portion which comes in contact with a green sheet, and a housing hole for housing the cutter section. The support portion is disposed on one end in axial direction with a relatively large outer diameter and thick-walled in the radial direction while the contact portion is disposed on the other end in the axial direction with a relatively small outer diameter and thin-walled in the radial direction.

In the present invention, a ceramic green sheet to be used for fabrication of an ordinary ceramic multi-layer substrate can be used. As the ceramic material, alumina, glass ceramic and the like are used. A green sheet is a non-hardened sheet-form material before being hardened by firing.

The punching apparatus of the present invention includes a base for laying a green sheet, a punching tool having a cutter section for punching and being movable toward the base, and a sheet retainer to be affixed to the punching tool, the sheet retainer having the above described features.

The punching apparatus is provided with mechanical structures such as a base for laying a green sheet, a punching tool attachable/detachable mechanism called a punch pin, for example, and an actuating mechanism for moving the punching tool toward the base.

The punching tool has a mechanism for moving to or moving away from the punching apparatus. The tip of the punching, tool forms a thin axial or needle-like cutter section corresponding to the diameter of the through hole to be punched.

The punching tool has a structure for affixing a sheet retainer in an attachable/detachable manner. As a structure for affixing the sheet retainer, a ridge or a groove, or an uneven shape such as pits and projections is provided around the punching tool.

The sheet retainer of the present invention is made of an elastic material such as rubber and is affixed to the punching tool in an attachable/detachable manner.

As the elastic material, synthetic rubber such as silicone rubber and synthetic resin may be used in addition to natural rubber. The hardness of the elastic material may be adjusted such that pressing of a green sheet can be adequately performed. Depending on the dimensions and shape of the sheet retainer, a material with hardness ranging between 50 to 60 degrees is used. Here, the hardness represents the value measured by using a spring type hardness tester as specified by JIS K 6301-1995 for measurement of hardness of vulcanized rubber. Also, a material with a high shape-restoring factor is preferable, and a material with a shape-restoring factor of substantially 100% toward the load applied while in use is preferable.

The shape of the sheet retainer is basically roughly cylindrical as a whole, and its one end in the axial direction has a support portion into which a punching tool can be engaged and the other end in the axial direction has a contact portion that comes in contact with a green sheet. A housing hole for housing the cutter section extends axially from the contact portion.

When the outer diameter of the support portion and the outer diameter of the contact portion are compared, the outer diameter of the support portion is made larger. Also, when the wall thickness of the cylindrical sheet retainer is measured in radial direction for the support portion and for the contact portion, it is greater for the support portion and smaller for the contact portion. The thick-walled support portion is hard to be deformed and the thin-walled contact portion is easy to be deformed.

The outer diameter may be tapered from the support portion toward the contact portion. The diameter may be changed by small steps. A combination of tapering and stepping may also be allowed.

The ratio between the wall thickness T1 in the radial direction at the contact portion and the maximum wall thickness Tmax in the radial direction may be kept at T1/Tmax=0.1 to 0.69. The maximum value T max of the wall thickness generally is at or in proximity to the support portion. The greater Tmax becomes, the greater the rigidity on the side of the support portion becomes, and the smaller T1 becomes, the easier elastic deformation on the side of the contact portion becomes. However, when T1/Tmax is too small making deformation on the side of the contact portion too easy, the pressing ability against the green sheet becomes insufficient.

DESCRIPTION OF THE PREFERRED EMBODIMENTS

First Exemplary Embodiment

Figure 1:
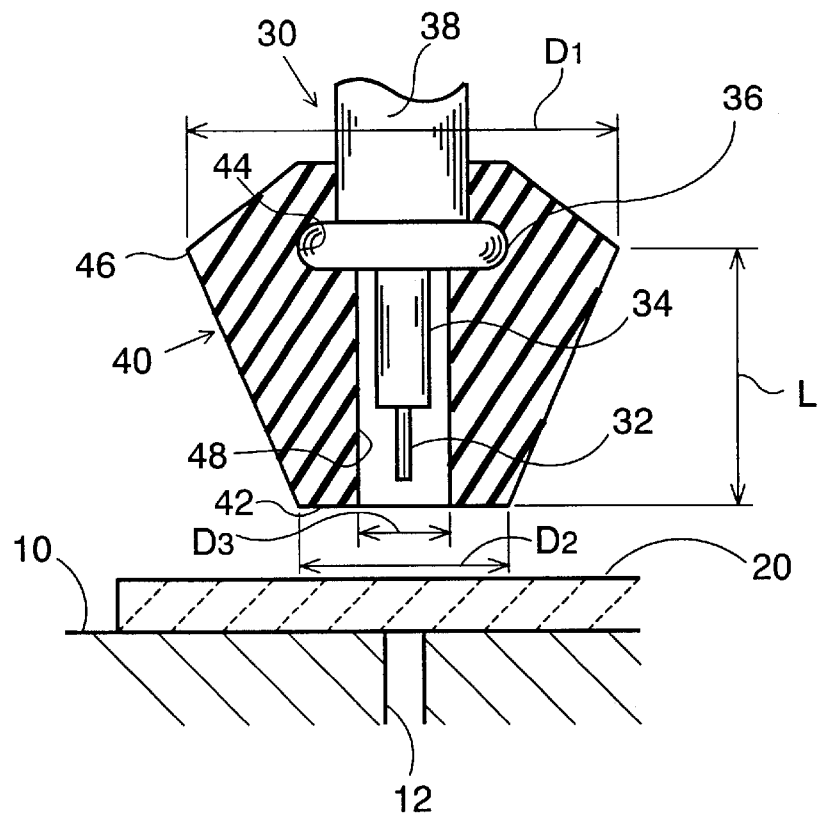
FIG. 1 is a cross-sectional view of a sheet retainer for punching and punching apparatus in a first exemplary embodiment of the present invention.
Figure 2:
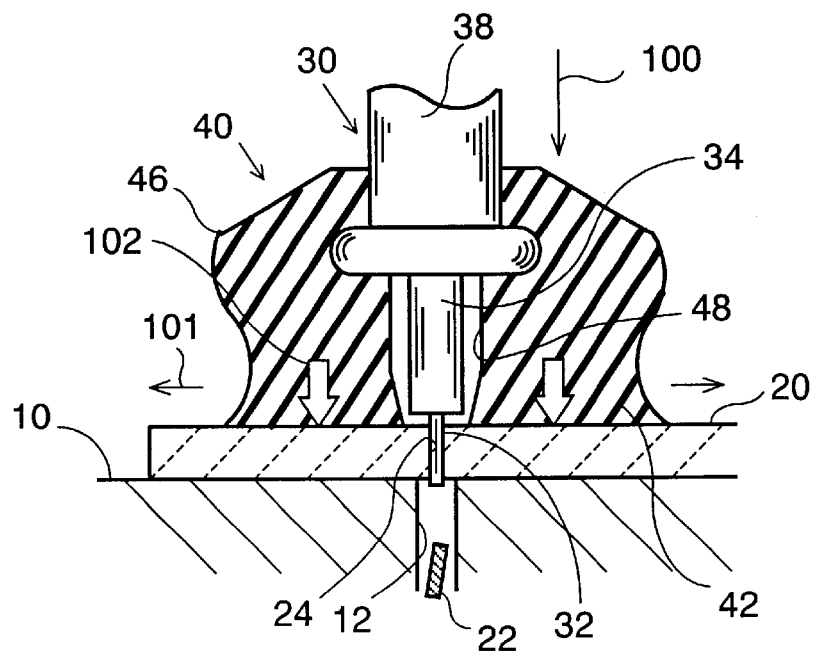
FIG. 2 is a cross-sectional view of the sheet retainer for punching and the punching apparatus while punching in the first exemplary embodiment.
Figure 3:
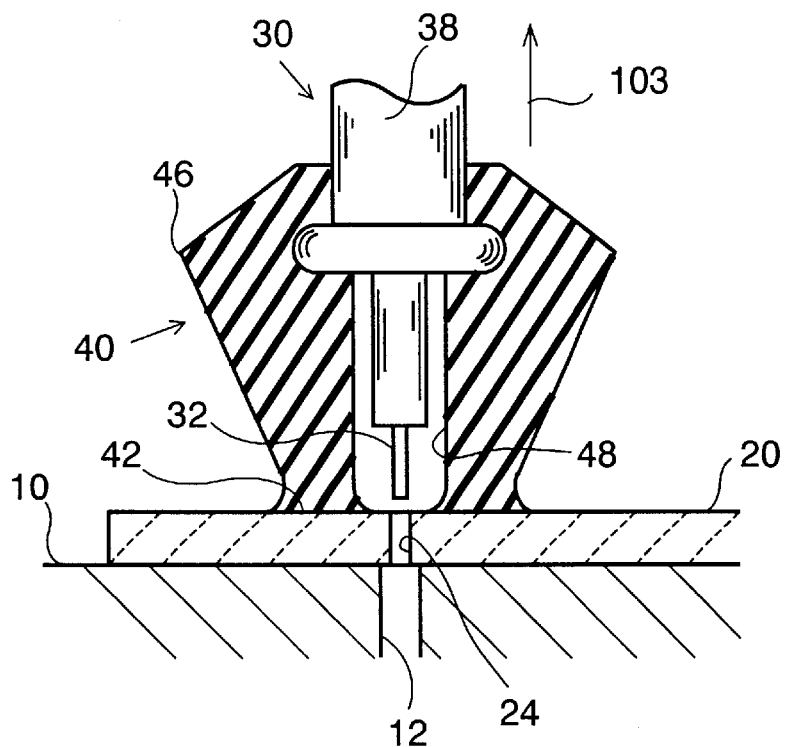
FIG. 3 is a cross-sectional view of the sheet retainer for punching and the punching apparatus after return in the first exemplary embodiment.

A description will be given on a punching apparatus in a first exemplary embodiment of the present invention. The punching apparatuses as illustrated in FIGS. 1 to 3 include a punching tool 30, a sheet retainer 40, and a base 10.

The base 10 is made of steel and the like and a green sheet 20 composed of a ceramic material is laid on its flat surface.

The base 10 is provided with an exhaust port 12 for punched scrap 22 to be ejected after punching.

The punching tool 30 is installed in a manner vertically movable with respect to the base 10.

A main shaft 38 supported by a driving mechanism (not shown) has, on its tip, an annular engagement ridge 36 projecting around its outer periphery. At the lower end of the engagement ridge 36 a columnar support shaft 34 is provided which has a diameter smaller than those of the engagement ridge 36 and the main shaft 38. At the lower end of the support shaft 34 a cutter section 32 is provided having a diameter smaller than that of the support shaft 34. The outer diameter of the cutter section 32 corresponds to the aperture of the through hole to be punched, and the length of the cutter section is slightly longer than the length of the through hole to be punched, namely, the thickness of the green sheet 20.

A sheet retainer 40 is affixed around the outer periphery of the punching tool 30.

The sheet retainer 40 is made of silicone rubber and is of tapered cylindrical shape. An annular engagement groove 44 is provided on the inner periphery of the sheet retainer 40. The sheet retainer 40 is secured onto the punching tool 30 by inserting the punching tool 30 into the sheet retainer 40 and fitting and engaging the engagement ridge 36 into the engagement groove 44.

The upper end portion of the sheet retainer 40 having the engagement groove 44 is a thick-walled support portion 46 with a large outer diameter D1. This portion has a high rigidity and allows the engagement groove 44 to securely fit and engage with the engagement ridge 36.

The outer diameter of the sheet retainer 40 is tapering from the support portion 46 toward the lower end side, and the front end forms a relatively deformable thin-walled contact portion 42 with an outer diameter D2 smaller than D1.

In the center of the sheet retainer 40 which extends from the support portion 46 to the contact portion 42, a housing hole 48 is provided in which the support shaft 34 and the cutter section 32 of the punching tool 30 are to be housed. The diameter D3 of the housing hole 48 is slightly larger than the outer diameter of the cutter section 32 and the support shaft 34. To be more specific, the diameter D3 of the housing hole 48 is set to be in the range 2.0 to 6.0 mm.

In the state in which the sheet retainer 40 is affixed to the punching tool 30, the tip of the cutter section 32 is so disposed that it is at a position higher than the front end surface of the contact portion 42, namely, deep inside the housing hole 48.

Next, a description will be given on the punching process. As illustrated in FIG. 1, a green sheet 20 is laid on the base 10. The punching tool 30 affixed with the sheet retainer 40 is disposed above the green sheet 20.

When the punching tool 30 is moved down as illustrated in FIG. 2 in the direction of arrow 100, the sheet retainer 40 comes in contact with the surface of the green sheet 20. When the punching tool 30 is moved down further, the sheet retainer 40 is elastically deformed in the direction of arrows 101. As that portion of the sheet retainer 40 which is close to the contact portion 42 on the front end has a low rigidity and is easily deformable, mainly this portion is deformed, and the posterior portion close to the support portion 46 is not much deformed because of a high rigidity. Also, the sheet retainer 40 is deformed in such a manner that the front end side having the contact portion 42 with a small outer diameter swells to outside thus assuring that the housing hole 48 in the center will not be narrowed excessively.

The cutter section 32 of the punching tool 30 punches the green sheet 20 to form a through hole 24. The punched scrap 22 produced by punching the through hole 24 drops from the exhaust hole 12 and is collected.

In this state, the elastically deformed sheet retainer 40 is pressing from above the periphery of that part of the green sheet 20 where the through hole 24 is formed (indicated by open arrows 102). Therefore, neither the working position of the green sheet 20 will move nor a slantingly directed resistive force is exerted on the cutter section 32 thereby enabling smooth punching of a through hole at an accurate position with an accurate shape. Furthermore, as the pressing force exerted by the sheet retainer 40 to the green sheet 20 has been set to a moderate strength by proper setting of the material and shape of the sheet retainer 40, no excessive force able to damage the green sheet 20 is exerted.

Next, as illustrated in FIG. 3, the punching tool 30 is moved up in the direction of arrow 103. As the sheet retainer 40 keeps pressing the green sheet 20 while being elastically deformed until the cutter section 32 is pulled out from the green sheet 20, lifting of the green sheet 20 together with moving up the cutter section 32 can be prevented.

When the punching tool 30 returns to its original position, the above-described state of FIG. 1 is restored and the elastic deformation of the sheet retainer 40 is also restored.

A practical sample of the sheet retainer of the present invention was fabricated and its performance was evaluated.

Practical specifications of the punching tool 30 and the sheet retainer 40 are as follows.

Outer diameter D1 of the support portion 46=14.0 mm
Outer diameter D2 of the contact portion 42=10.0 mm
Inner diameter D3 of the housing hole 48=5.0 mm
Wall thickness T1 of the contact portion 42=(D2−D3)/2= 2.5 mm
Maximum value Tmax of wall thickness=(D1−D3)/2=4.5 mm
T1/Tmax=0.56
Distance L between the support portion 46 and the contact portion 42 =10.0 mm
Working diameter of the cutter section 32=0.1 to 2.5 mm
Material of the sheet retainer 40: silicone rubber (hardness 60 degrees based on JIS K 6301-1995; shape restoring factor 100%)

Using the punching tool 30 of the above specifications, punching was performed on a green sheet 20.

Green sheet: glass ceramic (125-mm square, 235 μm thick)
Through holes: 1.5-mmΦ, 72 holes/sheet
Punching apparatus used: numerically controlled die punching apparatus No abnormality was observed on any of the through holes 24 on the green sheet 20 on which punching had been completed, and no damage of the green sheet 20 such as crack or deformation was observed. No abnormality was observed on the cutter section 32, either.

By changing the composition of the silicone rubber composing the sheet retainer 40, a plurality of sheet retainers 40 with different hardness were fabricated and their performance was evaluated. Table 1 shows the results.

TABLE 1

| Sheet Retainer 40 | Hardness | Evaluation |
|---|---|---|
| 1 | 70 degrees | Cracks and deformation remarkable |
| 2 | 65 degrees | Cracks and deformation took place |
| 3 | 60 degrees | Fine |
| 4 | 55 degrees | Fine |
| 5 | 50 degrees | Fine |
| 6 | 48 degrees | Green sheet stuck; unworkable |

As the results in Table 1 show, when the hardness of the sheet retainer 40 was 65 degrees or greater, cracks and deformation took place at the same time, while, when the hardness was 48 degrees or smaller, the green sheet 20 stuck to the sheet retainer 40 making punching work impossible. When the hardness was in the range 50 to 60 degrees, the green sheet 20 was finely processed, suggesting that the optimum hardness of the sheet retainer 40 is in the range 50 to 60 degrees.

Next, a description will be given on examples of conventional strippers made by varying degrees of hardness of the material.

With the exception of using a cylindrical sheet retainer with an approximately the same diameter over the entire body, punching was performed under the same conditions as described above. Though the outer diameter of the sheet retainer was the same 14.0 mm over the entire length, the outer diameter D2 of the contact portion was 13.0 mm as the bottom end had been chamfered. The material of the sheet retainer was silicone rubber.

A plurality of conventional examples was fabricated by changing the material hardness and their performance was evaluated. Table 2 shows the results.

TABLE 2

| Stripper | Hardness | Evaluation |
|---|---|---|
| 1 | 65 degrees | Cracks and deformation |
| 2 | 60 degrees | Cracks and deformation |
| 3 | 55 degrees | Cracks and deformation |
| 4 | 50 degrees | Cracks and deformation; sheet stuck |
| 5 | 48 degrees | Sheet stuck |

It can be found from the results of Table 2 that, with conventional strippers, fine results are not obtainable even by changing the material hardness.

From the above, technical significance of employing a sheet retainer having a specific construction and specific hardness in the present invention has been verified.

Next, a description will be given on the preferability of the ratio between the wall thickness T1 in the radial direction at the contact portion of the sheet retainer 40 that comes in contact with a green sheet and the maximum value Tmax of the wall thickness in the radial direction be T1/Tmax=0.1 to 0.69. With regard to the minimum value of T1/Tmax, when the ratio was 0.1 or smaller, deformation of the stripper was remarkable and unacceptable as the cutter section 32 came sometimes in contact with the deformed sheet retainer 40 thus breaking the work pin. With regard to the maximum value of T1/Tmax, so far as it was 0.69 or greater, the stripper became hard to be deformed thus suffering a problem of becoming unable to punch.

Second Exemplary Embodiment

Figure 4:
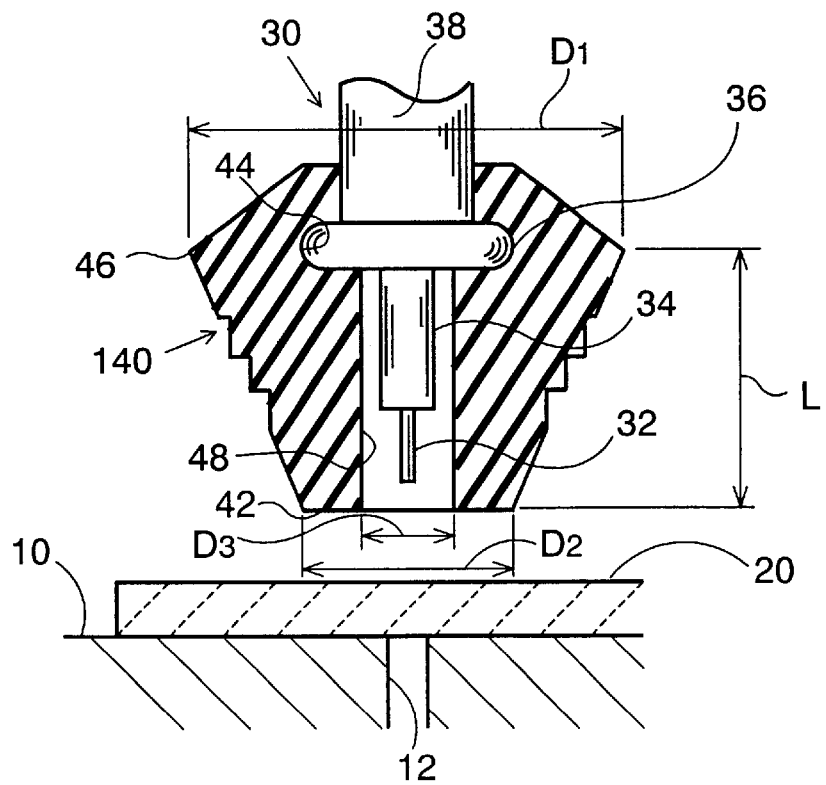
FIG. 4 is a cross-sectional view of a sheet retainer for punching and punching apparatus in a second exemplary embodiment.

Referring to FIG. 4, a description will be given on a second exemplary embodiment of a punching apparatus of the present invention.

The outer diameter of the portion between a support portion 46 and a contact portion 42 of a sheet retainer 140 is a combination of a tapering portion and a portion where the diameter decreases stepwise. A description of the remaining structure will be omitted as it is the same as in the first exemplary embodiment.

In compliance with the first exemplary embodiment, the punching apparatus is configured in such a manner that the support portion 46 is disposed on one end in the axial direction, has a relatively large diameter and is thick-walled in the radial direction, while the contact portion 42 is disposed on the other end in the axial direction, has a smaller outer diameter than that of the support portion 46 and is thin-walled in the radial direction.

As has been described above, the outer diameter of the portion between the support portion and the contact portion of the sheet retainer to be employed in the punching apparatus of the present invention is not limited to the shapes illustrated in FIG. 1 and FIG. 4. It is sufficient that the diameter decreases from the support portion towards the contact portion.

The sheet retainer for punching a, ceramic green sheet and the punching apparatus in accordance with the present invention are capable of keeping a green sheet properly retained during punching work, performing accurate and smooth punching work, as well as preventing cracks and deformation of the green sheet and damage to the cutter.

What is claimed is:

1. A sheet retainer for keeping a sheet at a correct position during manufacturing of the sheet, said sheet retainer being composed of elastic material and comprises:
    a support portion disposed on one end in the axial direction and being thick-walled in the radial direction,
    a contact portion disposed on the other end in the axial direction, being thinner-walled in the radial direction than the support portion and having an outer diameter smaller than an outer diameter of the support portion,
    a housing hole axially extending from said contact portion within said sheet retainer to the opposite end, and
    an engagement groove connected to the housing hole and having in the radial direction a diameter larger than a diameter of the housing hole, said engagement groove adapted for engaging and fixedly retaining therein a portion of a manufacturing tool,
    said sheet retainer having an outer surface with an outer diameter being (a) uniformly and inwardly tapered from a location opposite the engagement groove to the one end, and (b) uniformly and inwardly tapered from the location to the other end, and the taper of the outer surface from the location to the one end being different than the taper of the outer surface from the location to the other end.

2. A sheet retainer according to claim 1, wherein the outer diameter of the sheet retainer between said support portion and said contact portion is stepwisely decreased.

3. A sheet retainer according to claim 1, wherein the ratio of the wall thickness T1 in the radial direction of said contact portion of said sheet retainer and the maximum value Tmax of the wall thickness in the radial direction is expressed as T1/Tmax, and the ratio T1/Tmax is in the range of 0.1 to 0.69.

4. A sheet retainer according to claim 1, wherein the elastic material has a hardness from 50 degrees to 60 degrees (JIS K 6301-1995).

5. A sheet retainer according to claim 1, wherein said engagement groove is positioned so that the housing hole extends above and below said engagement groove.

6. A punching apparatus for punching a through hole in a sheet, comprising:
    a base for laying said sheet,
    a punching tool provided with a cutter section for performing said punching and being movable toward said base, and
    a sheet retainer, said sheet retainer being composed of elastic material and comprises:
        a support portion disposed on one end in the axial direction and being thick-walled in the radial direction,
        a contact portion disposed on the other end in the axial direction, being thinner-walled in the radial direction than the support portion and having an outer diameter smaller than an outer diameter of the support portion,
        a housing hole axially extending from said contact portion within said sheet retainer to the opposite end, and
        an engagement groove connected to the housing hole and having in the radial direction a diameter larger than a diameter of the housing hole, said engagement groove adapted for engaging and fixedly retaining therein a portion of said punch tool,
        said sheet retainer having an outer surface with an outer diameter being (a) uniformly and inwardly tapered from a location opposite the engagement groove to the one end, and (b) uniformly and inwardly tapered from the location to the other end, and the taper of the outer surface from the location to the one end being different than the taper of the outer surface from the location to the other end.

7. A punching apparatus according to claim 6, wherein the outer diameter of the sheet retainer between said support portion and said contact portion is stepwisely decreased.

8. A punching apparatus according to claim 6, wherein the ratio of the wall thickness T1 in the radial direction of said contact portion of said sheet retainer and the maximum value Tmax of the wall thickness in the radial direction is expressed as T1/Tmax, and the ratio T1/Tmax is in the range of 0.1 to 0.69.

9. A punching apparatus according to claim 6, wherein the elastic material has a hardness from 50 degrees to 60 degrees (JIS K 6301-1995).

10. A punching apparatus according to claim 6 wherein said engagement groove is positioned so that the housing hole extends above and below said engagement groove.

* * * * *

UNITED STATES PATENT AND TRADEMARK OFFICE
CERTIFICATE OF CORRECTION

PATENT NO. : 6,647,845 B1
DATED : November 18, 2003
INVENTOR(S) : Ochi et al.

It is certified that error appears in the above-identified patent and that said Letters Patent is hereby corrected as shown below:

Title page,
Item [57], ABSTRACT,
Line 3, delete "40".
Line 4, delete "30" and "32".
Line 5, delete "20".
Lines 5-6, delete "40 of the present invention".
Line 8, delete "46".
Line 10, delete "30".
Line 11, delete "42".
Line 14, delete "20" and "48".
Line 15, delete "42" and "32".

Column 8,
Line 52, "6" should read -- 1--.

Signed and Sealed this

Sixth Day of July, 2004

JON W. DUDAS
*Acting Director of the United States Patent and Trademark Office*